US006406962B1

United States Patent
Agnello et al.

(10) Patent No.: US 6,406,962 B1
(45) Date of Patent: Jun. 18, 2002

(54) VERTICAL TRENCH-FORMED DUAL-GATE FET DEVICE STRUCTURE AND METHOD FOR CREATION

(75) Inventors: Paul D. Agnello, Wappingers Falls; Arne W. Ballantine, Round Lake; Ramachandra Divakaruni, Somers; Erin C. Jones, Tuckahoe, all of NY (US); Edward J. Nowak, Essex Junction; Jed H. Rankin, S. Burlington, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/761,931

(22) Filed: Jan. 17, 2001

(51) Int. Cl.$^7$ .............................................. H01L 21/336
(52) U.S. Cl. ...................... 438/268; 438/284; 438/270
(58) Field of Search ................................. 438/156, 157, 438/268, 269, 270, 272, 282, 284, 970

(56) References Cited

U.S. PATENT DOCUMENTS

| 5,312,782 A | 5/1994 | Miyazawa |
| 5,382,816 A | 1/1995 | Mitsui |
| 5,411,905 A | 5/1995 | Acovic et al. |
| 5,414,288 A | 5/1995 | Fitch et al. |
| 5,578,850 A | 11/1996 | Fitch et al. |
| 5,864,158 A | 1/1999 | Liu et al. |
| 5,872,037 A | 2/1999 | Iwamatsu et al. |
| 5,886,382 A * | 3/1999 | Witek .......................... 257/241 |
| 5,937,283 A * | 8/1999 | Lee .............................. 257/329 |
| 6,174,763 B1 * | 1/2001 | Beilstein et al. ............ 438/238 |
| 6,204,128 B1 * | 3/2001 | Hibi et al. ................... 438/270 |
| 6,228,706 B1 * | 5/2001 | Horak et al. ................ 257/301 |

* cited by examiner

*Primary Examiner*—John F. Niebling
*Assistant Examiner*—Angel Roman
(74) *Attorney, Agent, or Firm*—DeLio & Peterson, LLC; Kelly M. Reynolds; Mark F. Chadururjian

(57) ABSTRACT

The present invention relates to an apparatus and method of forming one or more FETs having a vertical trench-formed double-gate, with a plurality of nitride layers having oxide marker etch-stop layers provided periodically there-through, thereby adapting the FETs to have a plurality of selectable gate lengths. The present invention provides for control and formation of gate lengths scaled down to about 5 nm to about 100 nm, preferably from about 5 nm to about 50 nm. The plurality of pad nitride layers with the oxide etch-stop layers provide for the present FET to be connected to a plurality of contacts having a variety of connection depths corresponding to the gate lengths used, by etching a plurality of via in the pad nitride layers whereby such vias stop at selected ones of the etch-stop layers to provide vias adapted to connect with the selected ones of such contacts. Additional gate material may be deposited over a top surface of the selected plurality of nitride layers to allow for contacts to the gate electrodes of any given FET.

40 Claims, 9 Drawing Sheets

VERTICAL TRENCH-FORMED DUAL-GATE FET DEVICE STRUCTURE AND METHOD FOR CREATION

BACKGROUND OF THE INVENTION

1. Field of the Invention

The present invention relates generally to field-effect transistors (FET). More particularly, the present invention relates to an apparatus and method for forming a vertical double-gated FET having a pad nitride layer with a plurality of etch stop layers periodically there-through which provide the ability to fabricate a plurality of vertical-channel FETs with a variety of gate lengths on the same die.

2. Description of Related Art

Over the years, it has been indispensably necessary to reduce semiconductor device size in order to increase performance and decrease power consumption. As a result of such smaller semiconductors, an increased number of smaller integrated circuit contacts are required for making connections to such semiconductors.

In keeping up with modern technology, integrated circuits, such as field effect transistors (FETs), may be formed with gate lengths scaled below 50 nm. However, as gate lengths are formed below 50 nm, FET scaling becomes limited by the formation and control of such gates. Furthermore, the smaller FETs may require a larger number of contacts on a single chip. The limitations of controlling gates scaled below 50 nm, as well as the requirement of a plurality of contacts on a single FET, produce a variety of problems such as alignment problems, problems associated with making connections with contacts, gate length control, and low FET resistance, for example. Overall, the above problems have the effect of decreasing semiconductor reliability and performance, as well as leading to increased production costs.

Attempts have been made to both improve the reliability and performance of smaller semiconductors and increase the surface space on the substrate to provide an increased number of connection contacts connected to the substrate. Techniques provided to overcome the above problems have included, for example, merely defining the gate lithographically with high step heights, controlling and forming the gate by forming wrap-around gates with vertical carrier transport, and selective epitaxial growth procedures to form an "air-bridge" silicon structure.

However, the known techniques of forming FETs having vertical gates and increased surface space are not sufficient in forming and controlling smaller gate electrodes, such as those scaled below 50 nm, as well as increased surface space as a result of such smaller gates. Forming and controlling smaller gates by known techniques leads to semiconductors having decreased performance and reliability. Therefore, as integrated circuits become smaller, and therewith the gate electrodes, further improvements are needed in forming and controlling smaller gate dimensions. Improvements are also needed in providing semiconductors having the ability to accommodate and connect with a plurality of contacts having varying channel dimensions, such as varying lengths. In general, semiconductor circuits rely on transistors with different current drives, such as integrated circuits requiring channels with different device widths and lengths. While varying device widths are achievable with vertical transistors, there is a need for methods to form transistors of varying device lengths.

Bearing in mind the problems and deficiencies of the prior art, it is therefore an object of the present invention to provide an improved structure and method of making a vertical double-gated FET adapted to accommodate a plurality of gate lengths on the same die.

Another object of the present invention is to provide an improved structure and method of forming gates scaled below 50 nm.

It is yet another object of the present invention to provide an improved structure and method of making a FET adapted to contact with a plurality of contacts having varying gate lengths.

Yet another object of the present invention is to provide an improved structure and method of making a plurality of vertical-channel FETs with a variety of gate lengths on the same die.

Yet another object of the present invention is to provide an improved structure and method of making a FET with increased performance and reliability.

Yet another object of this invention is to form transistors with varying gate lengths in the vertical dimension.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming a FET, and the FET made, by first providing a substrate, preferably a silicon on insulator, silicon on sapphire, or bulk silicon wafer, with a pad layer thereover. In the preferred embodiment, the pad layer has a plurality of etch stop layers periodically therethrough. The etch stop layers may be provided through the pad layers equidistantly during deposition of the pad layer, or alternatively, the etch stop layers may be deposited at varying depths during deposition of the pad layer.

In the preferred embodiment, a plurality of contacts having varying dimensions are provided for connection to the substrate. In connecting the plurality of contacts to the substrate, a plurality of openings are first formed within the substrate whereby first and second openings traverse through the pad and plurality of etch stop layers, while other openings traverse through the pad layer stopping at a selected one of the plurality of etch stop layers. A vertical channel is then formed in the first opening traversing through the pad and plurality of etch stop layers, wherein first and second gates are then formed within such vertical channel. Subsequently, the plurality of contacts are connected to the substrate whereby at least one of the contacts connects to the vertical channel, at least one of the contacts connects to the second opening traversing through the pad and plurality of etch stop layers, while still other contacts of the plurality of contacts connect to the first and second gates. In the preferred embodiment, the substrate may also be provided with source and drain regions wherein the source and drain regions are provided at the first and second openings traversing through the pad and plurality of etch stop layers. Thus, the present invention provides a first vertical gate FET adapted to be connected to a single die wherein the die has on a surface thereof at least a second vertical gate FET having a differing gate length than a gate length of the first FET, the second FET being made by the above process.

In another embodiment, the present invention is directed to a method of forming a FET, and the FET made, wherein a substrate having an active region is provided, such as a silicon on insulator, silicon on sapphire, or bulk silicon wafer. A pad layer is provided over the substrate whereby the pad layer further has a plurality of etch stop layers. Preferably, the pad layer comprises a first pad layer and a second pad layer. More preferably, the pad layer comprises first a pad oxide layer having over a surface thereof a pad nitride layer. The plurality of etch stop layers preferably comprise a plurality of oxide etch stop layers.

Subsequently, a vertical channel, preferably comprising a grown active layer, is provided in the substrate whereby the vertical channel traverses through the pad and plurality of etch stop layers. Preferably, the vertical channel is formed in the trench by growing an underlying portion of a conductive layer of the substrate. Next, first and second gates are provided within the vertical channel. A plurality of contacts having varying depths are provided. A plurality of openings are then formed within the substrate wherein the openings are adapted to connect with selected ones of the plurality of contacts having varying dimensions. Preferably, a first opening of the plurality of openings traverses through the substrate connecting to the vertical channel, while a second opening traverses through the substrate connecting to the active region, while still other openings traverse through the pad layer stopping at a selected one of the plurality of etch stop layers.

The first and second gates may then be extended by depositing additional gate material over the surface of the openings which stop at selected ones of the plurality of etch stop layers. The plurality of contacts are then connected to the substrate whereby at least a first contact of the plurality of contacts connects to the first opening over the vertical channel, while at least a second contact connects to the second opening over the active region, while still other contacts of the plurality of contacts connect to the first and second extended gates, thereby providing a vertical gate FET having the plurality of contacts with varying depths.

In yet another embodiment, the present invention is directed to a method of forming multi-gate FET, and the multi-gate FET formed, by providing a substrate, such as a silicon on insulator, silicon on sapphire, or bulk silicon wafer, having an active semiconductor layer, such as a layer of silicon, silicon germanium, silicide, or titanium silicide, is provided. A pad layer is provided over the substrate whereby the pad layer further has a plurality of etch stop layers. Preferably, the pad layer comprises a first pad layer and a second pad layer having a plurality of etch stop layers over the first pad layer. More preferably, the pad layer comprises first a pad oxide layer deposited by CVD to a thickness ranging from about 30 A to about 300 A, followed by a pad nitride layer comprising silicon nitride layers deposited by nitridization or CVD to a thickness ranging from about 800 A to about 10,000 A. The pad nitride layer further has the plurality of etch stop layers, preferably a plurality of oxide etch stop layers comprising silicon dioxide deposited to a thickness ranging from about 5 A to about 50 A during deposition of the pad nitride layers. The plurality of oxide etch stop layers deposited periodically therethrough the pad nitride layer adapt the substrate to be connected to a plurality of contacts having varying depths.

Alternatively, the first pad layer, or the pad oxide layer, may further have a plurality of etch stop layers preferably deposited periodically during deposition of the first pad layer, or pad oxide layer. Preferably in such alternate embodiment, the plurality of first pad layers comprise a plurality of pad oxide layers having a plurality of nitride etch stop layers deposited periodically during deposition of the pad oxide layer. More preferably, the pad oxide layer with the plurality of nitride etch stop layers is deposited to a combined thickness of about 2000 A with the plurality of nitride etch stop layers deposited to a thickness of about 10 A about every 200 A of the pad oxide layer deposition.

Subsequently, a vertical trench is formed whereby the vertical trench traverses through the first pad layer and second pad layer having the plurality of etch stop layers stopping at a surface of the active semiconductor layer of the substrate. A vertical channel is then formed in the vertical trench, preferably by growing the active semiconductor layer, and subsequently first and second vertical gates are formed within the vertical channel.

Preferably, the vertical trench is formed by first etching a top surface of the second pad layer stopping at a top surface of the first pad layer. A conformal layer is then provided over a surface of the substrate thereby at least coating the trench with the conformal layer. Preferably, the conformal layer is an insulating material comprising ASG, BPSG, PSG, or combinations thereof, deposited to a thickness ranging from about 200 A to about 2000 A. A filler material, comprising polysilicon, carbon, germanium oxide, germanium nitride, $TiO_2$, or combinations thereof, is then provided over the substrate to at least filling remaining portions of the trench. First and second spacers are then formed by etching the conformal layer, therein also forming an isolation region which isolates the vertical double gate FET from adjacent FETs on a single die. The isolation is then filled with an isolation material, preferably silicon dioxide or BPSG, thereby separating the vertical double gate FET from adjacent FETs on a single die. An underlying portion of the active semiconductor layer is then exposed by etching the filler material and any underlying portions of the first pad layer.

In yet a further aspect, in an embodiment wherein the active semiconductor layer comprises a silicide disposed upon silicon, the step exposing an underlying portion of the active semiconductor layer is performed by etching the filler material, any underlying portions of the first pad layer, and over-etching the substrate down to an active silicon layer of the substrate wherein the active silicon layer acts as a seed layer for the subsequent epitaxial growth procedure.

Once the active semiconductor layer is exposed the vertical channels are then formed by epitaxially growing the exposed portion of the active semiconductor layer. First and second vertical gates may then be formed within the vertical channel. Preferably, the first and second vertical gates are formed by forming conductor holes by patterning and etching the first and second spacers to expose an underlying portion of the first pad layer. Thin diffusion regions are then formed in the conductor holes by growing the exposed first pad layer to at least fill a portion of the conductor holes. The conductor holes may then be provided with a gate material, preferably polysilicon, titanium, tungsten aluminum, or gold, to a thickness ranging from about 5 nm to about 100 nm whereby the gate material fills the remaining portions of the conductor holes to form the first and second gates.

A plurality of contacts having varying dimensions are provided for connection to the substrate. In connecting the plurality of contacts to the substrate, a plurality of openings are formed within the substrate wherein the openings are adapted to connect with selected ones of the plurality of contacts having varying dimensions. Preferably, a first opening of the plurality of openings traverses through the substrate connecting to the vertical channel, while a second opening traverses through the substrate connecting to the active region, while still other openings traverse through the pad layer stopping at a selected one of the plurality of etch stop layers.

In another aspect of the present invention, the first and second gates may be extended, preferably horizontally, by depositing additional gate material over the surface of the openings which traverse through the pad layer stopping at selected ones of the plurality of etch stop layers.

Subsequently, the plurality of contacts are connected to the substrate whereby at least one of the contacts connects to the vertical channel, at least one of the contacts connects to the second opening traversing through the pad and plurality of etch stop layers stopping at the active semiconductor layer of the substrate, while still other contacts of the plurality of contacts connect to the extended first and second gates. In the preferred embodiment, the substrate may also be provided with source and drain regions wherein the source and drain regions are provided at the first and second openings traversing through the pad and plurality of etch stop layers. Thus, the present invention provides a first vertical gate FET adapted to be connected to a single die wherein the die has on a surface thereof at least a second vertical gate FET having a differing gate length than a gate length of the first FET, the second FET being made by the above process. In yet a further embodiment, the present invention provides a method of making a die having multiple FETs with varying gate lengths by providing a die with a first FET having a first gate length whereby the FET is made by the steps of: a) providing a substrate having an active layer; b) providing a pad layer having a plurality of etch stop layers periodically therethrough over the substrate; c) providing a plurality of contacts having varying dimensions; d) forming a plurality of openings adapted to connect with the plurality of contacts having varying dimensions wherein at least first and second openings traverse through the pad and plurality of etch stop layers, while other openings traverse through the pad layer stopping at selected ones of the plurality of etch stop layers; e) forming a vertical channel in the first opening traversing through the pad layers and the plurality of etch stop layers; f) forming at least first and second vertical gates in the vertical channel; and g) connecting the plurality of contacts to the substrate whereby at least one of the contacts connects to the vertical channel, while at least another of the contacts connects to the second opening traversing through the pad and plurality of etch stop layers, while still other contacts connect to the first and second gates, thereby providing the first FET having a first gate length over the die. The die is then provided with a second FET made by repeating the above steps a) through g) to provide a plurality of FETs having differing gate lengths over a single die.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 12 illustrates a cross sectional view of the plurality of FETs over the single die whereby a differing number of nitride and oxide layers have been removed to expose silicon pillars having varying depths of the plurality of vertical-channel FETs on a single die which are subsequently insulated.

DESCRIPTION OF THE PREFERRED EMBODIMENT(S)

Figure 1:
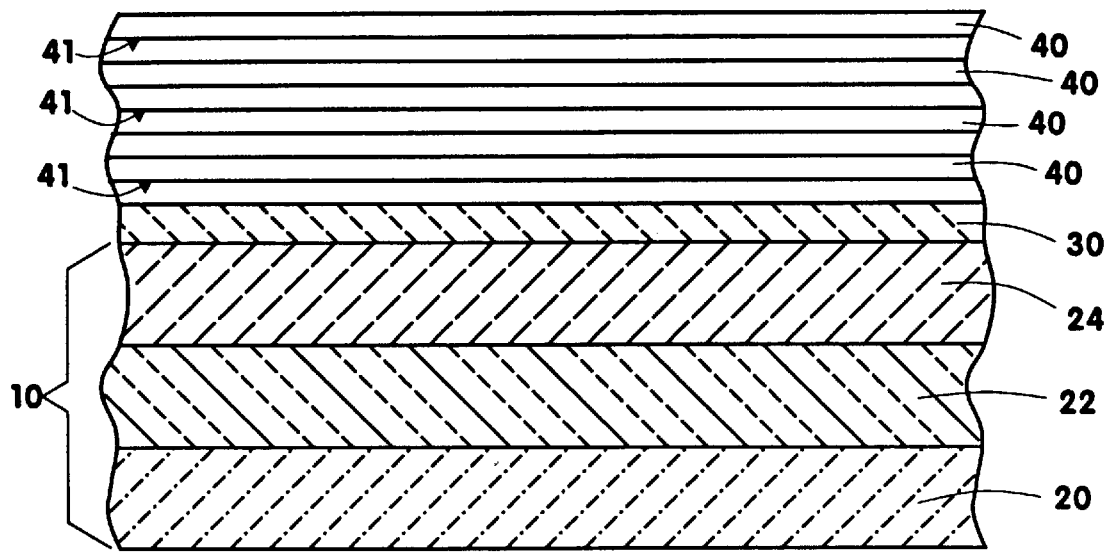
FIG. 1 illustrates a cross sectional view of a starting silicon on insulator substrate of the present invention having thereon a pad oxide layer followed by a plurality of pad nitride layers spatially separated by oxide marker etch stop layers.

In describing the preferred embodiment of the present invention, reference will be made herein to FIGS. 1–15 of the drawings in which like numerals refer to like features of the invention. Features of the invention are not necessarily shown to scale in the drawings.

FIGS. 1–15 show a preferred embodiment of the present invention comprising a FET, and a method of making the same, having a vertical trench formed double-gate with a plurality of nitride layers having oxide marker etch stop layers provided periodically there-through. The present invention provides for control and formation of gate lengths scaled down to about 5 nm to about 100 nm, more preferably from about 5 nm to about 50 nm. The plurality of nitride layers in combination with the oxide marker layers enable the fabrication of a plurality of vertical channel FETs with varying gate lengths on a single die. In doing so, the plurality of nitride layers and oxide etch stop layers allow a FET to be fabricated with any of a variety of gate lengths corresponding to the height at which the stack of the nitride and oxide films are etched to prior to final gate electrode etch back. In the present invention, the stack of nitride and oxide layers are etched to a length which corresponds to a depth or length of a selected contact for connection to the FET.

In the preferred embodiment, the present invention comprises a substrate, for example, a silicon on insulator (SOI), silicon on sapphire, or bulk silicon substrate. Preferably the wafer comprises first a substrate layer, such as silicon, sapphire, and the like, followed by an insulator layer, such as an oxide, nitride and the like, and subsequently a semiconductor layer, comprising silicon, silicon germanium, and the like. Alternatively, wherein the contact resistance across the semiconductor layer must be reduced, a silicide layer comprising tungsten silicide, titanium silicide, and combinations thereof, may be disposed upon the semiconductor layer.

Preferably, the double gates are formed in a conventional SOI wafer having a bottom silicon substrate, a bottom oxide layer, and an active silicon layer. As illustrated in FIG. 1, the substrate comprises an SOI wafer 10 comprising a substrate silicon layer 20, followed by an insulating oxide layer 22, and subsequently an active, semiconductor silicon layer 24. The silicon layer 24 is provided over the oxide layer 22 and acts as a seed layer for a subsequent selective epitaxially growth step. The oxide layer 22 and silicon layer 24 are provided over silicon layer 20 by techniques known and used in the art, such as, SIMOX (oxygen-implanted silicon), silicon on insulator substrate bonding, and the like.

Bottom source and drain regions are then formed in the silicon layer 24 using techniques known and used in the art, such as block level photolithography, ion implantation, and the like. Preferably, the source and drain implants are patterned by known techniques and subsequently implanted into the active, semiconductor silicon layer 24 typically at a dose of about 3–5×10$^{15}$ cm$^2$ of arsenic at 1–5 keV for n-type FETs and at a dose of about 3–5×10$^{15}$ cm$^2$ of BF$_2$ p-type FETs. Subsequently, the source and drain regions may be activated by known techniques, such as rapid thermal annealing.

Subsequently, a pad oxide layer 30 is deposited over the SOI wafer followed by a plurality of nitride layers having oxide marker etch stop layers. First, the pad oxide layer 30 is conformally deposited or grown over the surface of the SOI substrate 10 by techniques known and used in the art, such as oxidation or chemical vapor deposition (CVD), to a thickness ranging from about 30 A to about 300 A. In the preferred embodiment, the pad oxide layer 30 is grown to a thickness of about 60 A. Thereover the pad oxide layer is the pad nitride layer 40 wherein the pad nitride layers are separated by the plurality of oxide marker etch stop layers 41. In the present invention, the pad oxide layer 30 serves to protect or insulate the underlying semiconductive layer, such as silicon, from the pad nitride layer. Wherein it is desired that the FET have a constant height, the pad oxide layer 30 is conformally deposited, or thermally grown, over the semiconductor silicon layer 24 of the SOI substrate 10, followed by deposition of the pad nitride layers 40 with the oxide etch stop layers 41. See FIG. 1. In an alternative embodiment, the pad oxide layer and the pad nitride layers with oxide marker layers may be deposited alternately using techniques as known and used in the art.

In the preferred embodiment, after providing the oxide layer 30 over the substrate, the plurality of pad nitride layers 40, in combination with the plurality of oxide marker etch stop layers 41, are then provided over the pad oxide layer 30. The oxide etch stop layers 41 are periodically deposited or grown over the SOI substrate 10 during and between the deposition of the plurality of nitride layers 40 and provide stress relief to the nitride layers 40. Furthermore, the oxide marker layers 41 provide the ability to define multiple gate dimensions. The oxide marker layers 41 act as etch stop layers allowing a plurality of contacts having varying connection lengths or depths to be connected to a FET, thereby providing the ability to fabricate a plurality of vertical-channel double gate FETs with a variety of gate lengths on the same die. The oxide marker layers 41 act as etch stop layers by indicating a selected one of the plurality of oxide marker layers to stop the etch process in forming the vertical trench of the present invention. Thus, the oxide marker layers 41, provided between the nitride layers, are adapted to provide stress relief of the pad nitride layers as well as act as etch stop layers for subsequent connection between a die and a plurality of FETs having a plurality of contacts with varying depths.

In forming the pad nitride layers 40 and the oxide marker layers 41, the plurality of pad nitride layers 40 are formed by techniques as known and used in the art, such as nitridization, CVD, and the like, to preferably comprise silicon nitride (Si$_3$N$_4$) layers. The plurality of oxide marker layers 41 are deposited or grown periodically during the pad nitride layers 40 deposition by techniques as known and used in the art, such as oxidation, wherein O$_2$ containing chemicals such as O$_2$, N$_2$O, are periodically released to form the oxide marker layers 41 preferably comprising silicon dioxide (SiO$_2$) layers. However, as will be recognized by one skilled in the art, the nitride layers 40, oxide marker layers 41, oxide layer 30, and nitride marker layers 31 may comprise pairs of insulating materials which are selected based on etch selectivity. For example, the nitride layers may comprise an insulating material such as silicon nitride, while the oxide layers may comprise insulating materials including doped glass layers, BSG, ASG, PSG, SiCOH, SiLK, and the like, whereby the nitride and oxide materials may be etched selectively to one another.

In the preferred embodiment, the combined pad nitride layers 40 with oxide marker layers 41 are deposited to a thickness ranging from about 800 A to about 10,000 A, preferably to 2000 A. Each oxide marker layer 41 may be deposited or grown to a thickness ranging from about 5 A to about 50 A, preferably to about 10 A, wherein there are N number of oxide marker stop layers 41 spatially separated from each other by the pad nitride layers 40. See FIG. 1. After the oxide marker layers 41 have been formed, the pad nitride and oxide layers may expand at different rates as they are heated. If the oxide marker layers are too thin the pad nitride layer may crack or create film stress. Thus, the oxide marker layers 41 may be increased in thickness for additional nitride stress relief. In the preferred embodiment, the plurality of oxide marker layers 41 are equidistant from each other wherein when the plurality of pad nitride layers 40 are deposited to a thickness of about 2000 A, ten (10) oxide marker stop layers 41 are grown periodically and equidistantly during formation of the pad nitride layers 40, such that each of the ten (10) oxide marker layers 41 has a thickness of about 10 A or about every 200 A during the formation of the plurality of pad nitride layers 40. Alternatively, the oxide marker layers 41 may be formed and spaced at varying thicknesses and distances from each other.

Figure 2:
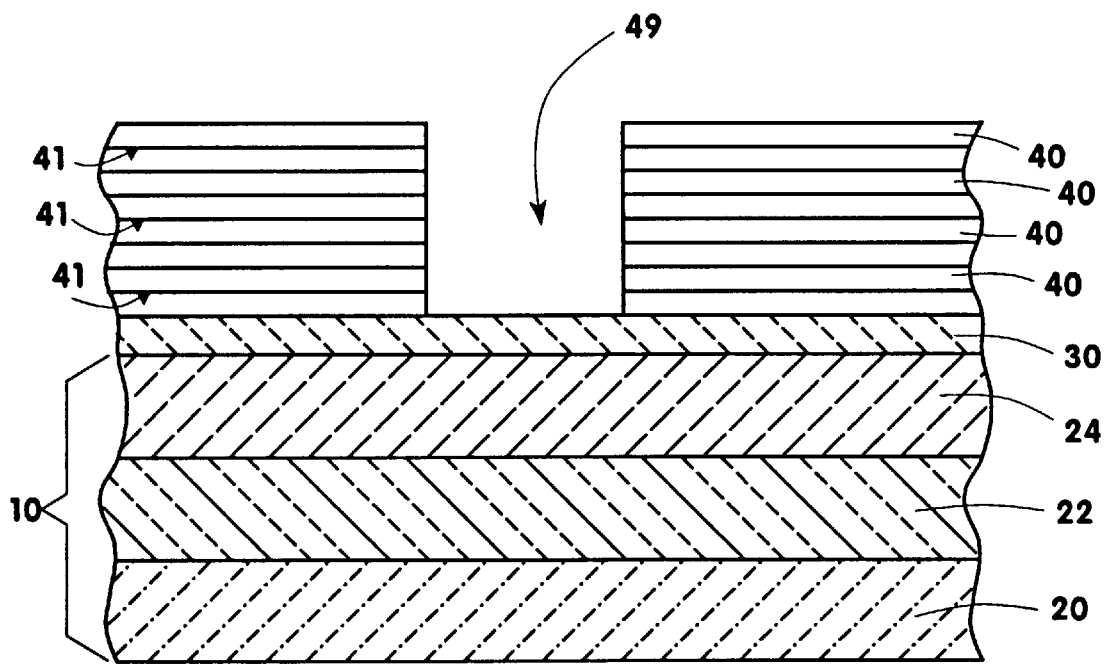
FIG. 2 illustrates a cross sectional view of FIG. 1 having a trench traversing therethrough the plurality of pad nitride layers and the plurality of oxide marker layers, whereby such trench stops at a surface of the oxide layer.

As illustrated in FIG. 2, after oxide layer 30, the plurality of pad nitride layers 40, and the oxide marker layers 41 have been formed over SOI substrate 10, a vertical trench or opening 49 is formed. The trench 49 is substantially vertical for subsequent spacer and gate electrode formation. Trench 49 is formed by patterning a top portion of the substrate using a first photolithographic mask and subsequently etching by anistropic techniques known and used in the art, such as, reactive ion etching (RIE). In the preferred embodiment, trench 49 is formed by lithographic procedures of coating with a photoresist, and then exposing to obtain an image. The image is then transferred into the plurality of pad nitride layers 40 by RIE to form trench 49, wherein trench 49 traverses through the pad nitride layers 40 and oxide marker layers 41, stopping at a top surface of the pad oxide layer 30, as illustrated in FIG. 2.

Figure 3:
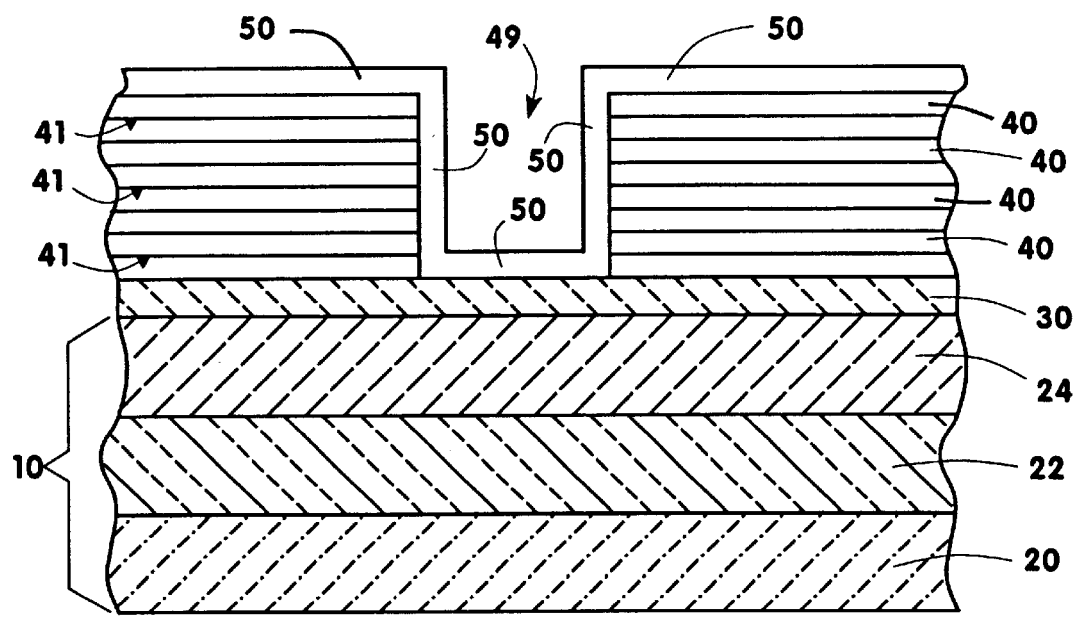
FIG. 3 illustrates a cross sectional view of FIG. 2 having a conformal layer deposited thereover.
Figure 4:
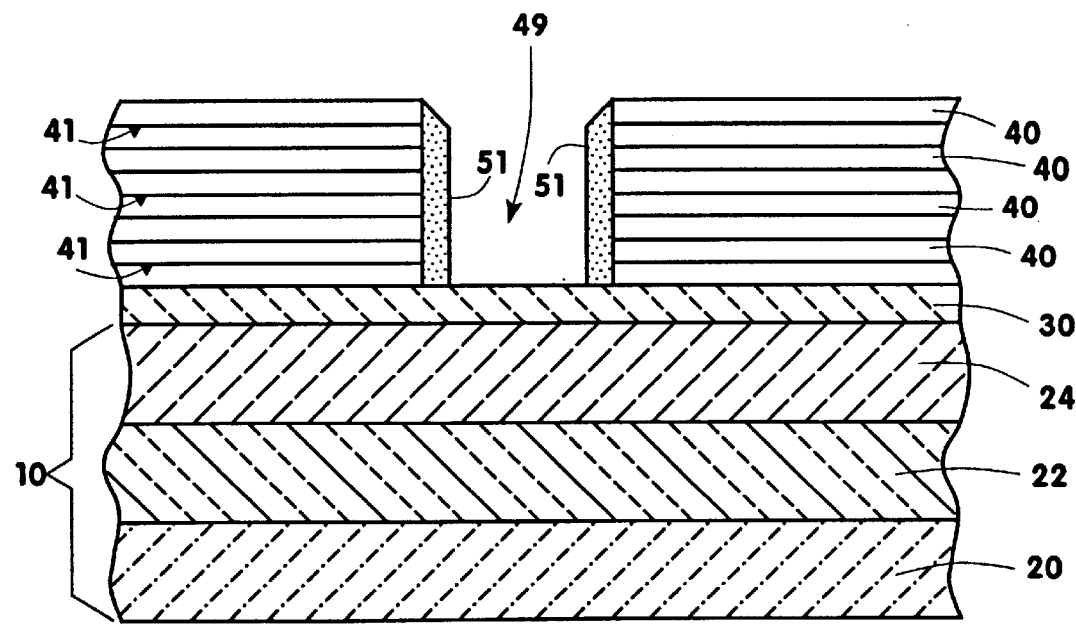
FIG. 4 illustrates a cross sectional view of FIG. 3 wherein the conformal layer is isolated on sidewalls of the trench.
Figure 5:
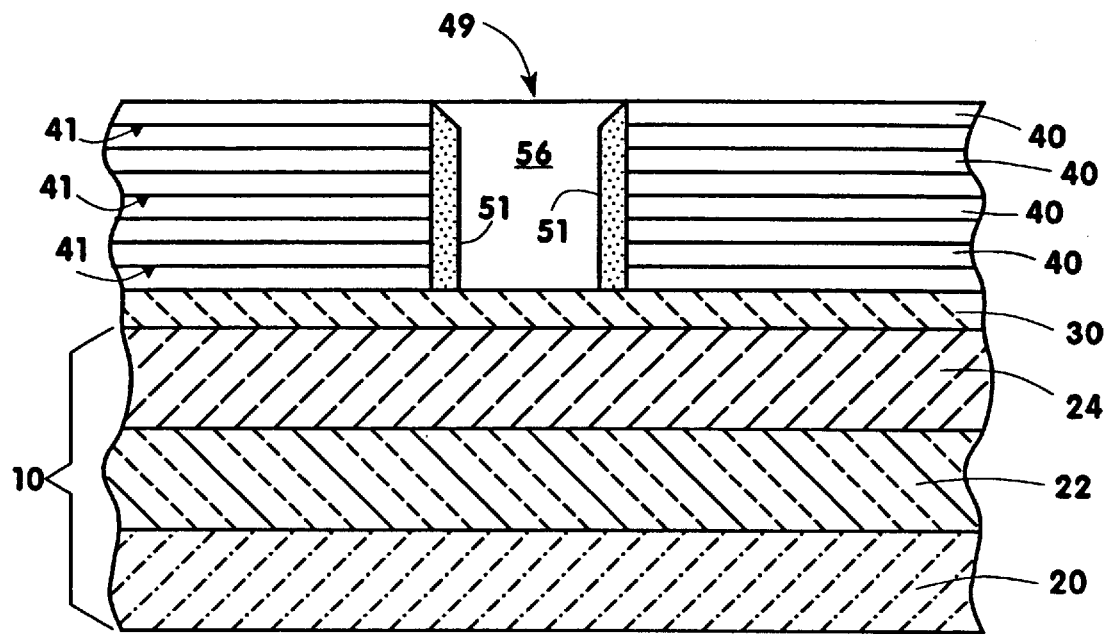
FIG. 5 illustrates a cross sectional view of FIG. 4 wherein the remaining, unfilled portions of the trench area is filled with a filler material.

FIG. 3 illustrates after formation of the trench 49, a thin conformal layer 50 is provided over the substrate by techniques as known in the art, to a thickness ranging from about 200 A to about 2000 A. The conformal layer 50 comprises a sacrificial dielectric material including arsenic silicon glass (ASG), BPSG, PSG, and combinations thereof. In the preferred embodiment, the conformal coating layer 50 comprises ASG deposited by CVD to a thickness ranging from about 5 nm to about 20 nm. The silicon on insulator substrate 10 is then anistropically etched to approximately the thickness of the deposited conformal coating layer 50 to leave only sidewall spacers 51 lining the vertical walls of the trench 49 comprising the selected material of the conformal coating layer 50. See FIGS. 4–6.

Subsequently, a filler material 56 is deposited to at least fill remaining portions of trench 49. The filler material 56 may be deposited by sputtering, CVD, and the like. After deposition the filler material is subsequently polished to remove any excess filler material from the top surface of the substrate. See FIG. 5. Filler layer 56 may comprise a sacrificial material including polysilicon, carbon, germanium oxides, germanium nitrides, $TiO_2$, and combinations thereof, which is etchable selective to both the oxide layer 30 and spacers 51 comprising the conformal layer material. In the preferred embodiment, trench 49 is filled with a polysilicon material deposited by CVD to at least fill trench 49. Polishing of the polysilicon fill layer 56 is performed by techniques as known and used in the art, including chemical mechanical planarization, RIE, and the like. The filler layer 56 serves to protect any underlying silicon during subsequent etch steps and must be able to be selectively removed with respect to the pad oxide layer 30 and the spacers 51.

Figure 6:
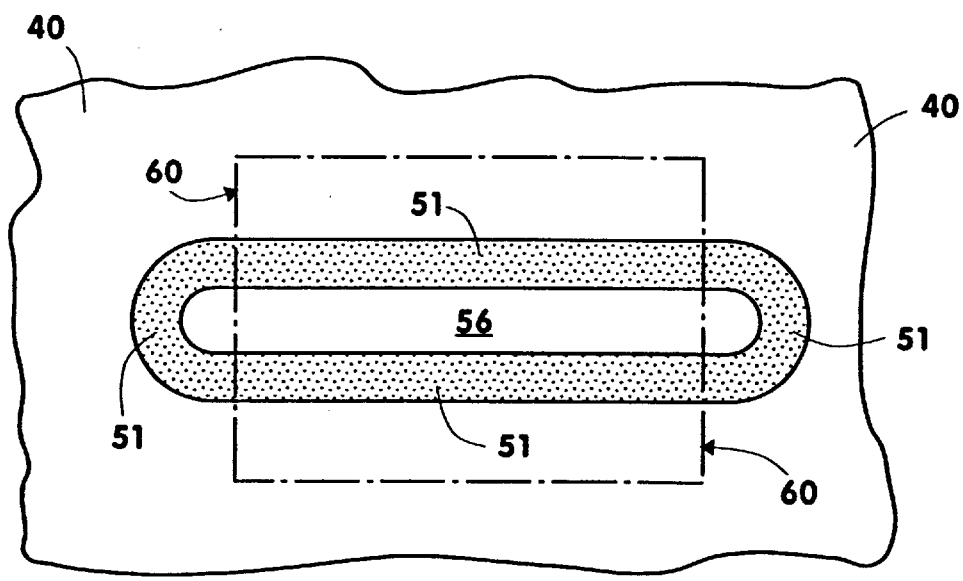
FIG. 6 illustrates a top plane view of FIG. 5 showing a pattern formed on the silicon on insulator substrate of FIG. 5 which is etched to at least form a pair of spacers within the trench as well as an isolation region.

As illustrated by the top plane view of FIG. 6, after the filler material 56 is deposited into trench 49, a pattern 60 is formed over a top surface of the substrate by lithography, whereby the pattern at least provides for formation of a pair of spacers in a subsequent etch step. As will be recognized by one skilled in the art, the pattern may be provided over the substrate to provide for a plurality of spacers in a subsequent step, whereby the plurality of spacers are used to form a vertical multi-gated FET. In the preferred embodiment, etching of the area outside of the pattern 60, as shown by the dashed line in FIG. 6, removes the unprotected portions of polysilicon filler layer 56 and conformal layer 50 on the sidewalls of the trench to form a pair of spacers 52 and 53 on sidewalls of the trench 49. See FIGS. 7A and 7B. Spacers 52 and 53 have therebetween, on inner sides of the spacers, the polysilicon fill layer 56 with the plurality of pad nitride layers 40 and oxide marker layers 41 on outer sides of each spacer. See FIGS. 7A–C. In the preferred embodiment, spacers 52 and 53 comprise ASG spacers formed from the conformal ASG layer 50 on the sidewalls of the trench.

Furthermore, the etch step that cuts ASG spacers 52 and 53 also etches away portions of the plurality of pad nitride layer 40, pad oxide layer 30, as well as the second semiconductive silicon layer 24, where silicon is not desired, stopping at a top portion of oxide layer 22 to form an isolation region around the FET. The isolation regions comprise openings or voids which traverse through the semiconductor layer, pad oxide layer and pad nitride layers. The isolated region comprises at least two portions of the pad nitride layer and etch stop layers with the pair of spacers therebetween, wherein the spacers have the filled opening therebetween. The isolated region further comprises an underlying portion of pad oxide and semiconductor layers which are isolated from adjacent pad oxide and semiconductor layer regions.

Figure 7A:
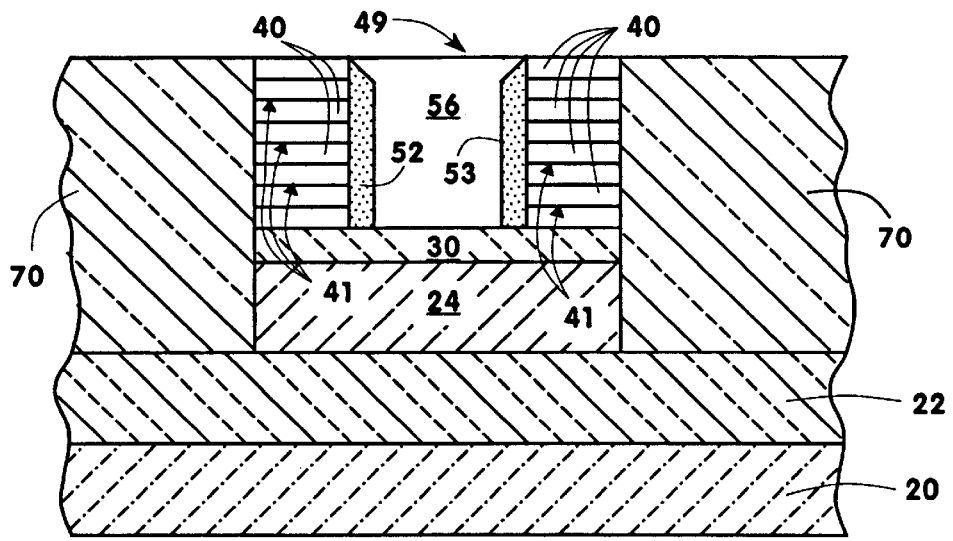
FIG. 7A is a cross sectional view of the isolated region formed by etching the pattern of FIG. 6.
Figure 7B:
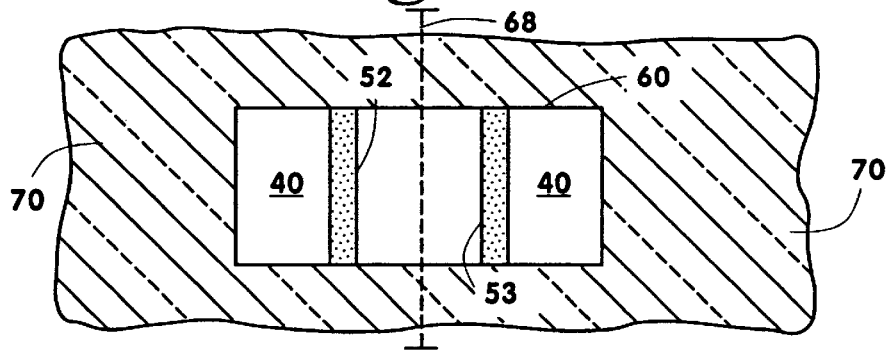
FIG. 7B is a top plane view of FIG. 7A showing the isolated region formed by etching the pattern of FIG. 6.
Figure 7C:
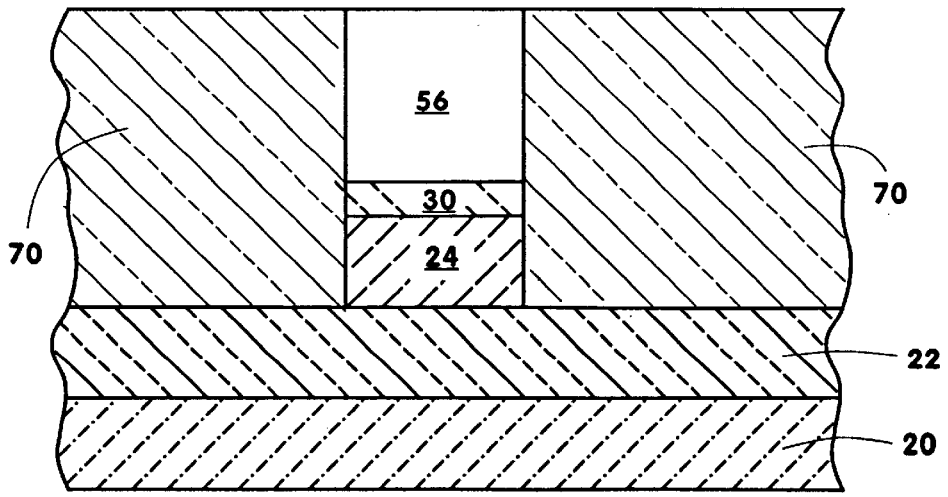
FIG. 7C is a cross sectional view of line 68 of FIG. 7B showing the isolated region formed by etching the pattern of FIG. 6.

The isolation region is then filled with a dielectric material, preferably an oxide layer 70, such as silicon dioxide, TEOS or HDP oxide, by known techniques, such as CVD, spin on, and the like, whereby the oxide layer 70 at least fills the opening. Thereafter, as shown in FIGS. 7A–C, the substrate is planarized by known techniques to remove any excess oxide layer 70 to allow for increased ease of subsequent patterning and polishing. As illustrated by FIG. 7A, a bottom surface of oxide layer 70 rests on a top surface of oxide layer 22 while separating the pad nitride layer 40 having oxide marker layers 41 into two portions. Furthermore, FIG. 7B shows a top plane view of the isolation region comprising oxide layer 70 surrounding and isolating the two portions of nitride layer 40 with oxide marker layers 41 portions having therebetween ASG spacers 52 and 53 which in turn have therebetween filler material layer 56. FIG. 7C illustrates a cross sectional view of dashed line 68 from FIG. 7B further illustrating that the ASG spacers 52 and 53 are separated by the filler material 56.

Figure 8:
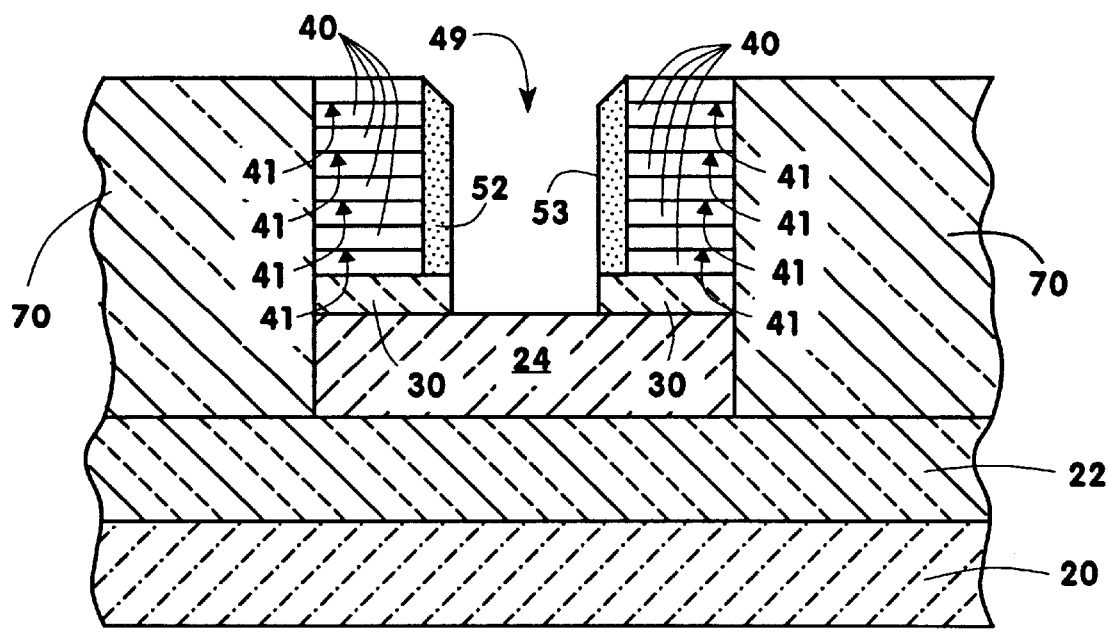
FIG. 8 illustrates a cross sectional view of FIG. 7A whereby the filler material and underlying oxide layer have been removed to form an opening in the substrate and expose an underlying portion of a semiconductive layer.
Figure 9:
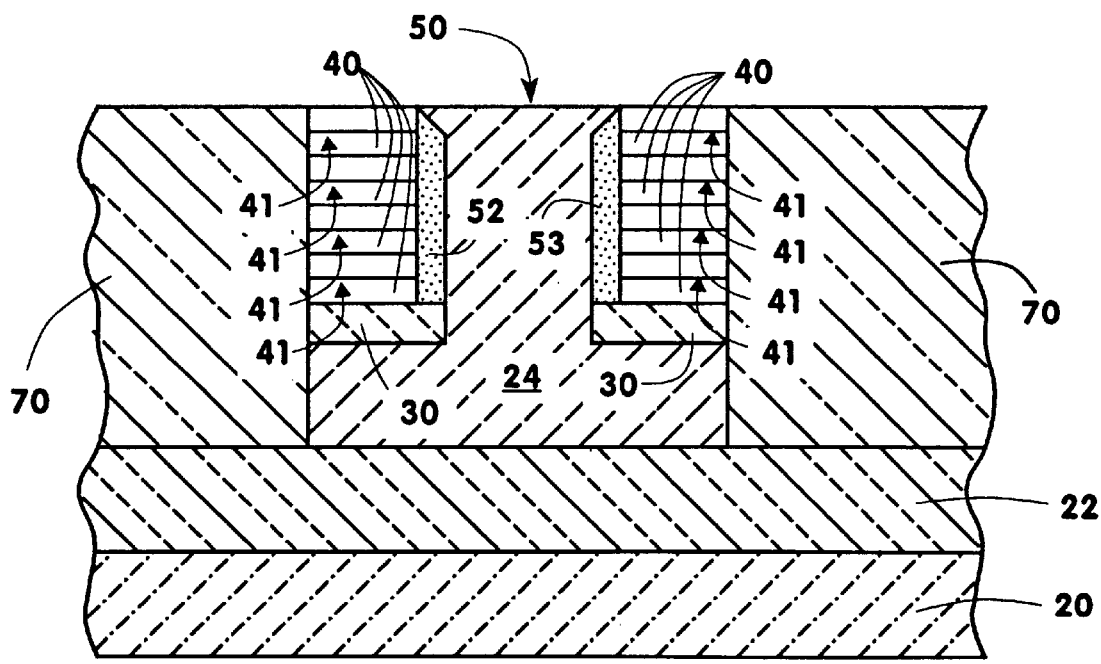
FIG. 9 illustrates a cross sectional view of FIG. 8 having epitaxially grown silicon to fill the opening of FIG. 8 to provide a vertical channel between the pair of spacers.

Subsequently, filler material 56 and any underlying pad oxide in the trench 49 are etched to expose a portion of the active semiconductor layer 24 on which silicon is then epitaxially grown to form a vertical channel 50. FIG. 8 illustrates the step of etching away polysilicon fill material 56, preferably by a $NH_4OH$ basic wet etch selective to the underlying oxide layer 30, thereby exposing a portion of semiconductive silicon layer 24 which acts as the seed layer for a subsequent selectively epitaxially growth process. In such etch step, spacers 52 and 53 act as masks to protect any underlying portions of oxide layer 30. Furthermore, the etch step may alternatively etch at least one nitride marker layer 40, thereby resulting in a substantially planar substrate surface. The exposed silicon seed layer 24 is selectively epitaxially grown by techniques as known and used in the art, such as CVD, and Low temperature epitaxy (LTE), to at least fill trench 49, thereby growing between the pair of spacers 52 and 53 to form the vertical channel 50 within trench 49. See FIG. 9. Thereafter, the substrate surface is substantially planarized by removing any excess epitaxially grown layer by techniques known and used in the art. See FIG. 9.

Alternatively, wherein the contact resistance across the second silicon layer 24 must be reduced, the conductive layer 24 may further comprise a silicide layer including tungsten silicide, titanium silicide, and combinations thereof, disposed upon the silicon layer, as discussed above. In such an embodiment, as is known, silicide is not optimal for epitaxial silicon growth, thus the step of etching trench 49 comprises over-etching the conductive silicide layer 24 down to the substrate silicon layer 20 which is subsequently used as the seed layer for the above discussed epitaxial growth step. In such an embodiment, the substrate silicon layer 20 is doped to form bottom source and drain regions by techniques as known and used in the art as discussed above.

Figure 10:
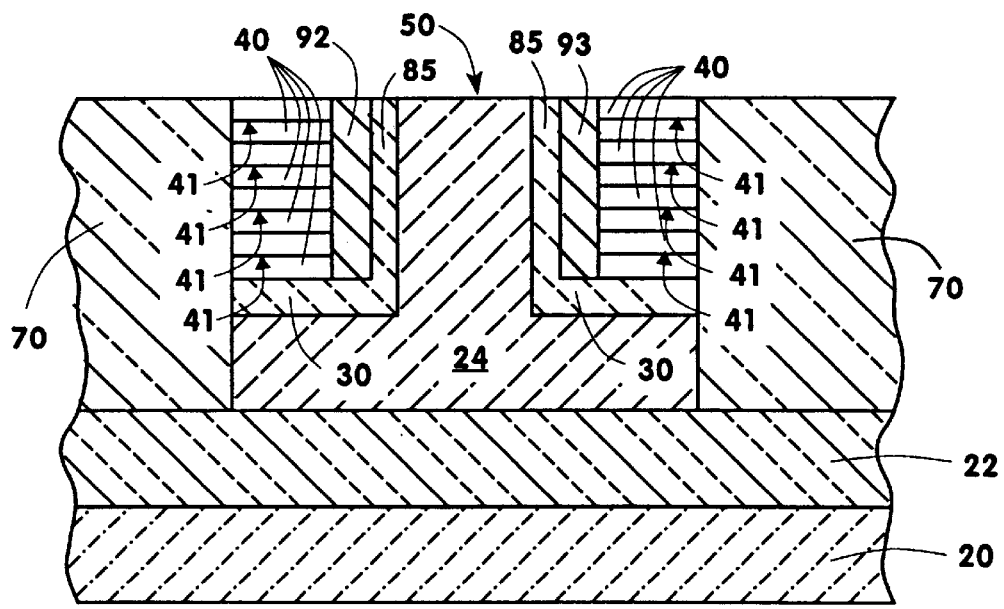
FIG. 10 illustrates a cross sectional view of FIG. 9 whereby the pair of spacers have been removed to create conductor holes which are subsequently filled with a thin gate oxide layer and a gate material to form a vertical double gate FET.

Next, as illustrated in FIG. 10, the double gates of the preferred embodiment are formed by etching spacers 52 and 53 to create conductor holes which expose an underlying portion of the pad oxide layer 30. The substrate is cleaned and then exposed portions of the oxide layer 30 are grown by techniques, such as thermal oxidation, to create thin gate oxide insulator regions 85 in portions of the conductor holes on outer sides of the epitaxially grown silicon, while leaving empty portions of the conductor holes. The thin gate oxide insulator regions 85 prevent an electrical short of the device channel to the gate electrodes. The thin oxide insulator regions 85 may be grown to a thickness ranging from about 9 A to about 50 A, preferably to about 10 A. Alternatively, high-k materials may be deposited as the gate dielectric rather than growing the thin gate oxide insulator regions. The high-k materials of the gate dielectric may include aluminum oxide, tantalum pentoxide, or zirconium dioxide deposited to a thickness ranging from about 15 A to about 50 A by methods such as atomic layer CVD (ALCVD). In a further alternate embodiment, an additional thin diffusion boundary layer may be provided in the conductor holes before deposition of a gate material to form the vertical double gates in the present invention.

Figure 11:
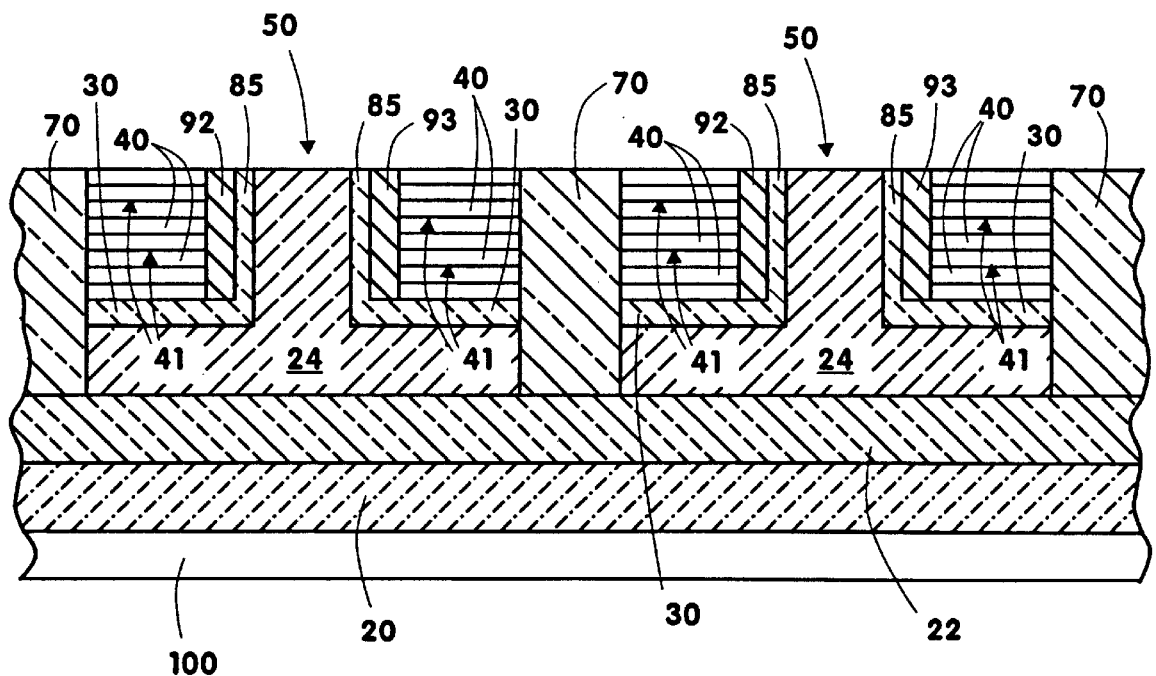
FIG. 11 illustrates a cross sectional view of the present invention having a plurality of FETs over a single die.

Subsequently a gate material is deposited over the substrate to fill the remaining portions of the conductor holes, thereby providing vertical trench formed double gates. As illustrated in FIG. 10, the remaining empty portions of the conductor holes are filled with a gate material to form vertical double gates 92 and 93. Vertical trench formed double-gates 92 and 93 are formed by depositing a gate material over the substrate to at least fill the remaining empty portions of the conductor holes. The gate material may include polysilicon, doped polysilicon, titanium, tungsten, aluminum, gold, and combinations thereof, deposited by CVD, EPI, ALCVD, sputter, and the like. Preferably, the vertical trench formed first gate 92 and second gate 93 of the double-gates comprise polysilicon deposited by CVD. As illustrated in FIG. 11, first vertical trench formed gate 92 and second vertical trench formed gate 93 of the vertical trench formed double-gates are separated from the silicon grown trench by the thin gate-oxide regions 85 for preventing electrical shorting of the semiconductor. Subsequently, the surface of the substrate is planarized by polishing, thereby removing any gate conductor material on the top surfaces of the wafer.

In the preferred embodiment of the present invention, a plurality of FETs may be formed on a surface of a die. As illustrated in FIG. 11, the above steps of providing an oxide layer 30 over an SOI wafer, followed by deposition of the plurality of nitride layers 40 having etch stop layers 41, forming a vertical trench 49 traversing through the plurality of nitride layers 40 and etch stop layers 41 stopping at an active layer of the substrate, and subsequently forming a vertical channel 50 and double gates 92 and 93 within the trench can be performed for a plurality of semiconductor devices on a single die 100. See FIG. 11. As further shown in FIG. 11, the FETs are provided over the single die 100 whereby adjacent FETs are separated from one another by the oxide layer 70. In doing so, the plurality of nitride layers 40 and etch stop layers 41 of the plurality of FETs over die 100 provide the ability to fabricate a plurality of vertical-channel double-gated FETs having a variety of gate lengths on the same die.

Subsequently, the desired vertical gate length of each of the FETs over the die 100 are provided by removing a subset of the nitride and oxide etch stop layers 40 and 41 to a length or depth corresponding to the desired gate length on each corresponding FET. In removing the desired nitride and oxide etch stop layers 40 and 41, the surface of the substrate is patterned by techniques as known and used in the art and subsequently portions of the nitride and oxide etch stop layers 40 and 41 are etched down to the selected oxide etch stop layer 41. Preferably, in etching the nitride and oxide etch stop layers resist masks are used to etch differing numbers of the nitride and oxide etch stop layers 40 and 41. Typically, a first resist mask is patterned to expose selected areas of the substrate wherein a subset of nitride and oxide etch stop layers 40 and 41 are removed over selected FETs. The first mask is stripped and a second mask applied and patterned to expose a second set of FETs over which a second number nitride and oxide etch stop layers 40 and 41 are removed, thereby providing differing numbers of remaining pad layers over the two sets of FETs. As will be recognized, by repetitive application of the above etch steps of removing desired nitride and oxide layers, differing numbers of layers of nitride and oxide etch stop layers 40 and 41 will remain on adjacent FETs on the die thereby providing FETs having differing gate lengths on the single die 100.

Figure 12:
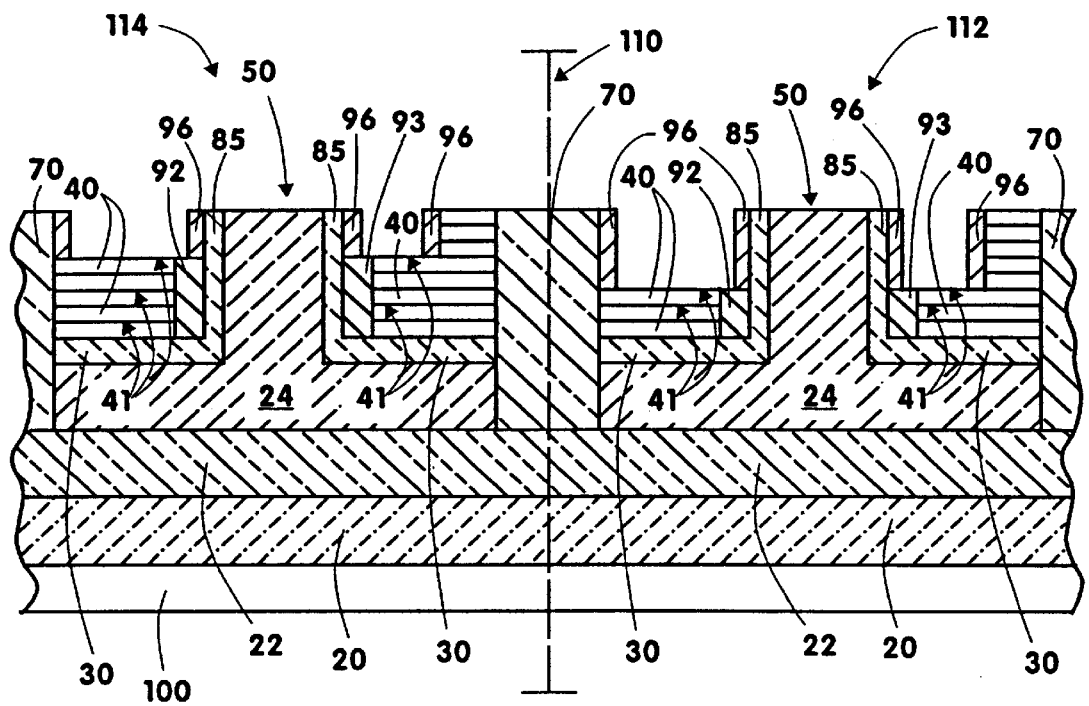
FIG. 12 illustrates a cross sectional view of the plurality of FETs over the single die whereby a differing number of nitride and oxide layers have been removed to provide for varying gate lengths of the plurality of vertical FETs on a single die.

Thus, the different gate lengths over the die 100 are achieved on each of the plurality of FETs over the die by removing different numbers of oxide and nitride layers, while leaving the complement number of oxide and nitride layers on the FET. For example, as illustrated in FIG. 12, the die 100 may have thereover a first FET 112 and a second FET 114 separated by the oxide layer 70 as depicted by the dashed line of reference numeral 110. As illustrated in FIG. 12, the nitride and oxide etch stop layers 40 and 41 on the first FET 112 have been etched down to the third oxide etch stop layer, for example, from the top surface of the plurality of nitride and oxide etch stop layers. Therefore three levels of the nitride layers 40 have been removed, as well as that portion of the gate material of gates 92 and 93 that corresponds to the depth of the third oxide etch stop layer 41. As further illustrated in FIG. 12, the nitride and oxide etch stop layers 40 and 41 on the second FET 114 over the die have been etched down to the fifth oxide etch stop layer, for example, from the top surface of the plurality of nitride and oxide etch stop layer. Therefore in FET 112 five layers of the nitride layers 40 have been removed as well as that portion of the gate material of gates 92 and 93 that corresponds to the depth of the fifth oxide etch stop layers 41. Thus, die 100 is provided with two FETs, for example, having differing gate lengths for connection to a variety of contacts having depths corresponding to the gate lengths. As will be recognized, a plurality of FETs can be provided over the die wherein the plurality of FETs have varying gate lengths.

Next top source and drain regions are optionally implanted comprising ion implants typically ranging from about $3 \times 10^{15}$ cm$^{-3}$ to about $5 \times 10^{15}$ cm$^{-3}$ at about 1 keV. The top source and drain regions are preferably implanted with a tilt to the implant angle of approximately 10 degrees off from a line normal to the plane of the substrate surface. Preferably top source and drains are implanted at tilts from multiple directions with respect to the substrate flat or notch, preferably at least four directions, in order to ensure that the epitaxial regions 50 protruding above the gate electrodes are doped to densities greater than $10^{20}$ cm$^{-3}$. In implanting the top source and drain regions, wherein the FET comprises a p-type FET dopants comprising BF$_2$ may be implanted, or alternatively wherein the FET comprises an n-type FET dopants comprising arsenic may be implanted.

Figure 13:
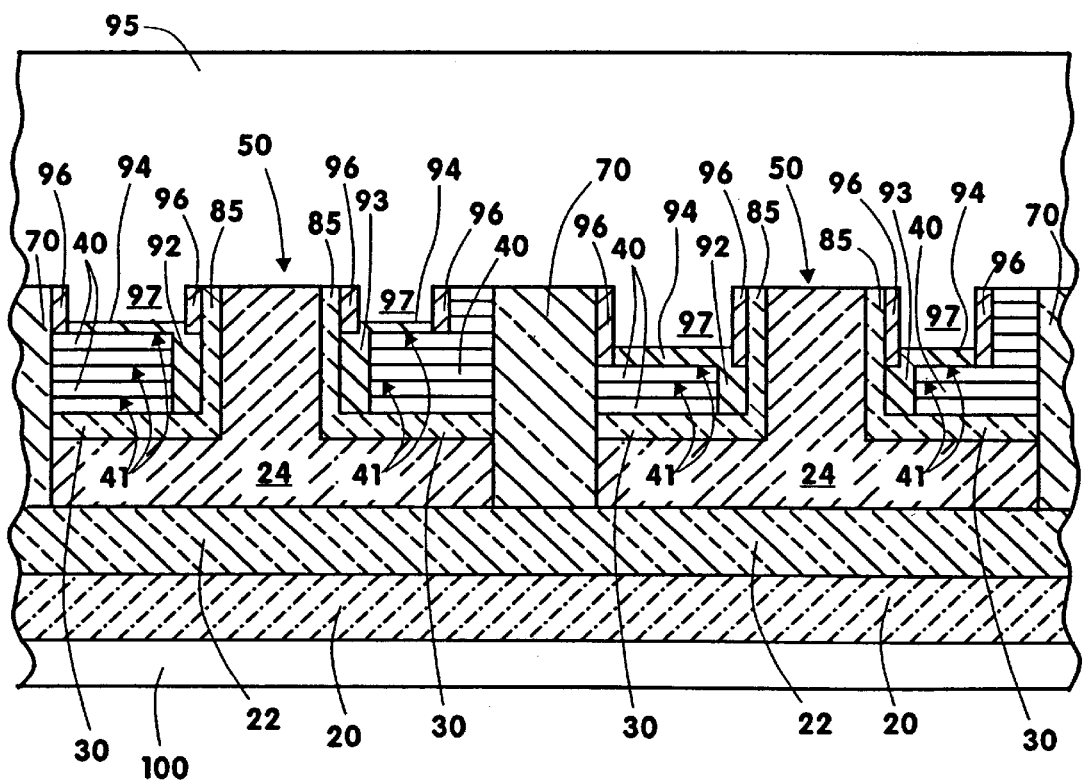
FIG. 13 illustrates a cross sectional view of FIG. 12 further comprising additional gate material provided over the substrate followed by an insulating dielectric layer.

Next, an insulator, preferably comprising silicon nitride, is deposited by known techniques, such as CVD, to a thickness less than the thickness of the gate conductor, preferably to a thickness of about 20% to about 50% less than the gate conductor thickness. The silicon nitride insulator is then anisotropically etched to leave spacers 96 on the sides of the exposed gate insulator 85 as well as on exposed sidewalls of the isolation oxide 70 and remaining nitride and oxide etch stop layers. See FIG. 12. Subsequently, additional gate or conductor material 94 may then be deposited over the FETs by known techniques. As illustrated in FIG. 13, the additional gate material 94 is deposited over the surface of FETs 112 and 114 in an amount sufficient to at least fill the opened layers of the nitride and oxide etch stop layers, thereby filling any recessed voids in double-gates 92 and 93. The additional gate material may include polysilicon, doped polysilicon, titanium, tungsten, aluminum, gold, tungsten nitride and combinations thereof.

It is to be noted that self alignment of the top source-drain regions to the channel region may be obtained by solid phase or gas phase doping of the epitaxially regrown pillar before the formation of the spacers 96.

Subsequently, the additional gate material is selectively etched back to a depth below the top surface of the FET as shown in FIG. 13 to leave at least a thin layer of additional gate material over a horizontal surface of the oxide etch stop layer 41 at which the nitride and oxide layers 40 and 41 etch process stopped. The additional gate material is etched to remove any additional gate material thereover a surface of the exposed silicon pillars 88. See FIG. 12. The horizontal portion of gate material connects with vertical gates 92 and 93, thereby extending the vertical double gates 92 and 93 horizontally, to serve as gate contact regions for subsequent connections to contacts having depths corresponding to the depth of the etched nitride and oxide etch stop layers. See FIG. 13. In etching the additional gate material, the gate material is etched back to leave the horizontal gate material of gates 92 and 93 having a thickness ranging from about 10 nm to about 100 nm on each of the FETs over the die 100. Furthermore, the etching back of the additional gate material exposes a portion of the epitaxially grown silicon column, as well as forms openings 97 in the etched back plurality of nitride layers 40 and oxide etch stop layers 41. See FIG. 13.

As further illustrated in FIG. 13, an insulating dielectric layer 95, such as phosphorus-doped silicon glass (PSG) or CVD deposited oxide, is deposited over the FETs by known techniques to a thickness ranging from about 0.2 μm to about 1 μm, or alternatively to a thickness to at least filling openings 97. Subsequently, the insulating layer 95 may be planarized by known techniques including reflow, Chemical-Mechanical Polishing, or etch back, and the like, as shown in FIG. 13.

Figure 14:
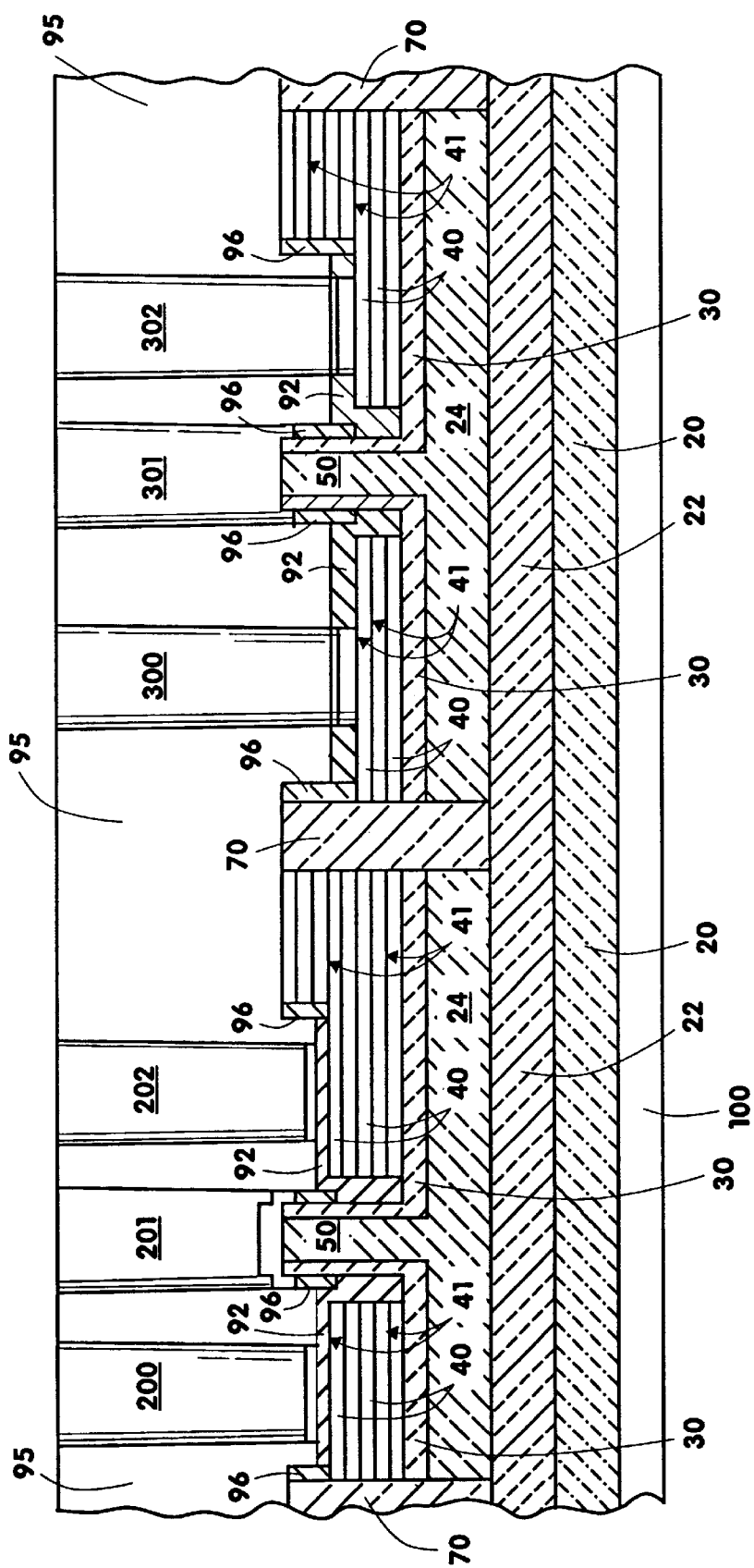
FIG. 14 illustrates a cross sectional view of FIG. 13 further comprising forming a plurality of contact vias on each of the plurality of vertical-channel FETs, whereby selected contact vias are formed over the silicon pillars to provide top source and drain regions, while others are connected to gate material of the double gates having varying depths.

Conventional contact vias may then be formed in the FETs by techniques known and used in the art. The conventional contact vias may be formed stopping simultaneously at the gates and the top source and drain regions at the top of the gates by known techniques. As illustrated in FIG. 14, for example, the surface of the FETs may be patterned and etched by known techniques, such as using a first mask and etching the first mask, to form contact vias 200 and 202 in FET 114 and contact vias 300 and 302 in FET 112. In such step, the surface of the substrate may be patterned with a resist and anisotropically etched through the insulator layer 95 stopping at the gate material regions where such contact vias 200, 202, 300, and 302 are desired. Subsequently, as further illustrated in FIG. 14, conventional contact vias for the top source and drain regions may then be formed, such as contact via 201 in FET 114 and contact via 301 in FET 112. Contact vias 201 and 301 may be formed using conventional methods, such as using a second mask and etching the second mask. In the preferred embodiment, in forming the contact vias at the gates of all FETs using the first mask the contact vias 200, 202, 300, and 302 may be provided over the gate material of the double gates of FETs 114 and 112 on both sides of the silicon pillar 88 to form the varying depth gate connects of FETs 114 and 112, while the top source and drain regions of all FETs may be formed over the silicon pillar 88 using the second mask. See FIG. 14. Subsequently, the vias are lined with a suitable liner material, such as titanium, and then filled with a tungsten metal of sufficient thickness to at least fill the deepest vias. The excess tungsten is then polished off the top of insulator 95 to leave a planar surface of the substrate.

Subsequently the FETs are provided with the contact vias to the bottom source and drain regions below the double vertical-formed gates. The active silicon regions 24 on adjacent FETs on the single substrate or die are patterned and anisotropically etched by conventional techniques, such as using a third mask and etching the third mask, to form contact vias 203 and 303 to provide FETs 112 and 114 with the bottom source and drain regions. See FIG. 15. Next, the formed contact vias 203 and 303 are lined with the liner material and then filled with the tungsten fill in an amount to at least fill such contact vias. An etch back or CMP planarization is then performed again to excess tungsten off the top of insulator 95 to leave a planar surface of the substrate. Subsequently, a plurality of contacts having varying lengths may be connected to the plurality of contact vias formed in all FETs over the single die.

Figure 15:
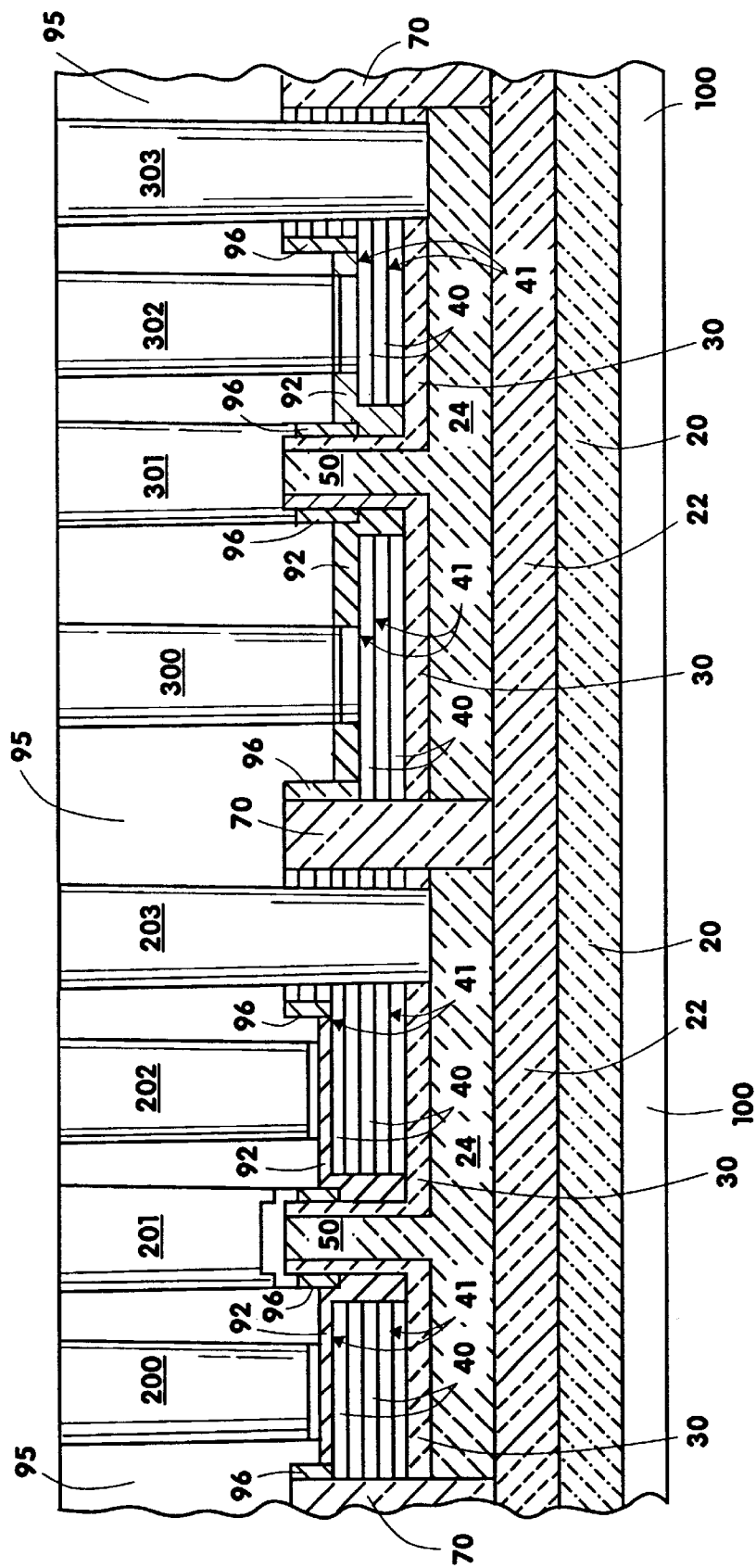
FIG. 15 illustrates a cross sectional view of FIG. 14 further comprising forming a second set of plurality of contact vias which form the bottom source and drain regions on the vertical-channel FETs to provide the plurality of vertical-channel FETs with a variety of gate lengths on the same die.

Thus, the present invention provides vertical trench formed double-gated FETs having pad nitride layers with a plurality of etch stop layers therethrough for adapting the FETs to be fabricated with varying gate lengths over the same die or substrate. Preferably, in etching the nitride and oxide etch stop layers resist masks are used to etch differing numbers of such nitride and oxide etch stop layers. Typically the resist mask is used to etch one of the oxide etch stop layers 41 and then subsequently the resist is stripped, whereby a layer of nitride layer 40 is removed selectively to the oxide by known wet etch techniques, such as hot phosphoric acid. By application of this method repetitively, differing FET gate lengths are achieved on the single die as shown in FIGS. 15 and 16. For example, as illustrated in FIG. 16, the first FET 112 on the die comprises a plurality of contacts attached to the die whereby three (3) layers of nitride and oxide etch stop layers 40 and 41 were required to be etched, while the second FET 114 on the die comprises a plurality of contacts attached to the die whereby five (5) layers were etched, thus providing the varying gate lengths over the same die.

Thus, the present invention overcomes the prior art by providing an improved FET, and a method of making such FET, having vertical trench formed double-gates wherein the FET is adapted to connect with a plurality of contacts having varying connection dimensions. The present invention also provides for improved control and formation of gates scaled below 50 nm. Furthermore, the present invention overcomes the prior art by providing a method and apparatus for forming a plurality of FETs having varying gate lengths over a single die, whereby the gates may be scaled below 50 nm. In forming and controlling the present double-gated FET, the present method substantially eliminates the problems associated with the prior art techniques of forming smaller gates, such as problems with alignment, connection contacts, gate length control, and low FET resistance, and the like, thereby improving the overall FET reliability, performance, manufacturability, usability, and reducing production costs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a FET comprising:
   providing a substrate having a pad layer thereover, said pad layer having a plurality of etch stop layers periodically therethrough;
   forming a plurality of openings adapted to connect with a plurality of contacts having varying dimensions wherein selected ones of said plurality of openings traverse through said pad layers and said plurality of etch stop layers, while still others of said plurality of openings traverse through said pad layer stopping at a selected one of said plurality of etch stop layers;
   forming a vertical channel in one of said selected ones of said plurality of openings traversing through said pad layers and said plurality of etch stop layers;
   forming first and second gates in said vertical channel; and
   connecting said plurality of contacts to said substrate whereby at least one of said contacts connects to said vertical channel, while at least one of said contacts connects to one of said selected ones of said plurality of openings traverse through said pad layers and said plurality of etch stop layers, while still other contacts connect to said first and second gates, thereby providing a vertical gate FET having the plurality of contacts with varying depths.

2. The method according to claim 1 further including providing source and drain regions to said substrate.

3. The method according to claim 2 wherein said source and drain regions are provided in said selected ones of said plurality of openings traversing through said pad layers and said plurality of etch stop layers.

4. The method according to claim 1 wherein said substrate comprises a silicon on insulator, silicon on sapphire, or bulk silicon wafer.

5. The method according to claim 1 wherein said plurality of etch stop layers are deposited equidistantly during deposition of said pad layer.

6. The method according to claim 1 wherein said plurality of etch stop layers are deposited at varying depths during deposition of said pad layer.

7. The method according to claim 1 wherein said vertical gate FET comprises a first vertical gate FET having the plurality of contacts with varying depths connected to a die, said die having thereon at least a second vertical gate FET made by the process of claim 1 wherein a gate length of said second vertical gate FET and a gate length of said first vertical gate FET are different.

8. A method of forming a FET comprising:
   providing a substrate having an active region;
   providing a pad layer over said substrate, said pad layer having a plurality of etch stop layers;
   forming a vertical channel traversing through said pad layer and said plurality of etch stop layers;
   forming first and second gates in said vertical channel;
   providing a plurality of contacts having varying depths;
   forming a plurality of openings in said substrate adapted to connect with selected ones of said plurality of contacts having varying dimensions, wherein a first opening of said plurality of openings traverses said substrate connecting to said vertical channel, a second opening of said plurality of openings traverses said substrate connecting to said active region, while still other openings traverse through said pad layer of said substrate stopping at a selected one of said plurality of etch stop layers;
   extending said first and second gates over a surface of said openings stopping at selected ones of said plurality of etch stop layers; and connecting said plurality of contacts to said substrate whereby at least a first contact of said plurality of contacts connects to said first opening connecting to said vertical channel, at least a second contact of said plurality of contacts connects to said second opening connecting to said active region, while still others of said plurality of contacts connect to said first and second extended gates over said openings stopping at selected ones of said plurality of etch stop layers, thereby providing a vertical gate FET having the plurality of contacts with varying depths.

9. The method according to claim 8 wherein said substrate comprises a silicon on insulator, silicon on sapphire, or bulk silicon wafer.

10. The method according to claim 8 wherein said pad layer comprises a first pad layer and a second pad layer.

11. The method according to claim 10 wherein said first pad layer comprises an oxide layer.

12. The method according to claim 10 wherein said second pad layer comprises a nitride layer.

13. The method according to claim 8 wherein said plurality of etch stop layers comprise a plurality of oxide etch stop layers.

14. The method according to claim 8 wherein said vertical channel in said trench is formed by growing an underlying portion of a conductive layer of said substrate.

15. The method according to claim 8 wherein said first and second gates are extended by depositing additional gate material over the surface of the openings stopping at selected ones of the plurality of etch stop layers.

16. A method of forming a vertical multi-gate FET comprising:
   providing a substrate having an active semiconductor layer;
   providing a first pad layer thereover said substrate;
   providing a second pad layer having a plurality of etch stop layers over said first pad layer;
   forming a vertical trench traversing through said first and second pad layers and said plurality of etch stop layers stopping at a surface of said active semiconductor layer of said substrate;

forming a vertical channel in said vertical trench by growing said active semiconductor layer;

forming first and second vertical gates in said vertical channel; providing a plurality of contacts having varying depths; forming a plurality of openings adapted to connect with said plurality of contacts having varying dimensions wherein at least one of said openings traverses through said first and second pad layers stopping at said active semiconductor layer, while other openings traverse through said second pad layer stopping at a selected one of said plurality of etch stop layers having a depth corresponding to a depth of at least one of said contacts having varying depths;

providing additional gate material over said selected one of said plurality of etch stop layers to horizontally extend said first and second vertical gates; and connecting said plurality of contacts having varying depths to said substrate whereby at least one of said contacts connects to said vertical channel, while at least one of said contacts connects to said active semiconductor layer, while still others connect to said first and second vertical gates, thereby providing a vertical double gate FET connected to the plurality of contacts having varying depths.

17. The method according to claim 16 wherein said semiconductor layer comprises a conductive material selected from the group consisting of silicon, silicon germanium, silicide, and titanium silicide.

18. The method according to claim 16 wherein said first pad layer is deposited to a thickness ranging from about 30 A to about 300 A.

19. The method according to claim 16 wherein said first pad layer comprises a pad oxide layer deposited by CVD to a thickness ranging from about 30 A to about 300 A.

20. The method according to claim 16 wherein said first pad layer further comprises a plurality of etch stop layers deposited periodically during deposition of said first pad layer.

21. The method according to claim 20 wherein said first pad layer having said plurality of etch stop layers comprises a pad oxide layer having a plurality of nitride etch stop layers deposited periodically during deposition of said pad oxide layer.

22. The method according to claim 21 wherein said pad oxide layer with the plurality of nitride etch stop layers is deposited to a combined thickness of about 2000 A with said plurality of nitride etch stop layers deposited to a thickness of about 10 A about every 200 A of said pad oxide layer deposition.

23. The method according to claim 16 wherein said second pad layer is deposited to a thickness ranging from about 800 A to about 10,000 A.

24. The method according to claim 16 wherein said second pad layer comprises a nitride layer deposited by nitridization or CVD to a thickness ranging from about 800 A to about 10,000 A.

25. The method according to claim 24 wherein said nitride layers comprise silicon nitride layers.

26. The method according to claim 16 wherein said second pad layer comprises a pad nitride layer having oxide etch stop layers wherein said oxide etch stop layers are deposited periodically during the pad nitride layer deposition for adapting said substrate to be connected to said plurality of contacts having varying depths.

27. The method according to claim 26 wherein said oxide etch stop layers comprise silicon dioxide.

28. The method according to claim 16 wherein said etch stop layers are deposited to a thickness ranging from about 5 A to about 50 A.

29. The method according to claim 16 wherein said gate material is a conductive material selected from the group consisting of polysilicon, titanium, tungsten aluminum, and gold.

30. The method according to claim 16 wherein said first and second gates have a thickness ranging from about 5 nm to about 100 nm.

31. The method according to claim 16 wherein the steps of forming said vertical channel comprises:

a) forming said trench by etching a top surface of said second pad layer stopping at a top surface of said first pad layer;

b) providing a conformal layer over a surface of said substrate thereby at least coating said trench with said conformal layer;

c) depositing a filler material over said substrate to at least filling remaining portions of said trench;

d) forming at least first and second spacers by etching said conformal layer;

e) exposing a portion of said active semiconductor layer by etching said filler material and any underlying first pad layer; and f) forming said vertical channel by epitaxially growing said exposed portion of said active semiconductor layer.

32. The method according to claim 31 wherein said conformal layer is an insulating material selected from the group consisting of ASG, BPSG, PSG, and combinations thereof.

33. The method according to claim 31 wherein said conformal layer is deposited to a thickness ranging from about 200 A to about 2000 A.

34. The method according to claim 31 wherein said filler material is polysilicon, carbon, germanium oxide, germanium nitride, $TiO_2$, or combinations thereof.

35. The method according to claim 31 wherein said active semiconductor layer comprises a silicide disposed upon silicon, said step g) further comprises over-etching said substrate down to an active silicon layer of said substrate wherein said active silicon layer acts as a seed layer for subsequent epitaxial growth.

36. The method according to claim 31 wherein said steps of forming said first and second spacers by etching said conformal layer said step (d) further forms an isolation region.

37. The method according to claim 36 further including the step of filling said isolation region with an isolation material thereby separating said vertical double gate FET from adjacent FETs on a single die.

38. The method according to claim 37 wherein said isolation material is silicon dioxide or BPSG.

39. The method according to claim 31 wherein the steps of forming said first and second vertical gates comprise:

g) forming conductor holes by patterning and etching said first and second spacers to expose an underlying portion of said first pad layer;

h) forming thin diffusion regions in said conductor holes by growing said exposed first pad layer to at least fill a portion of said conductor holes; and i) form said first and second gates by providing a gate material over said substrate thereby filling remaining portions of said conductor holes.

40. A method of making a die having multiple FETs with varying gate lengths comprising:

providing a die;

providing a first FET having a first gate length over said die whereby said FET is made by the steps of:

a) providing a substrate having an active layer;
b) providing a pad layer having a plurality of etch stop layers periodically therethrough over said substrate;
c) providing a plurality of contacts having varying dimensions;
d) forming a plurality of openings adapted to connect with said plurality of contacts having varying dimensions wherein at least first and second openings traverse through said pad layers and said plurality of etch stop layers, while other openings traverse through said pad layer stopping at selected ones of said plurality of etch stop layers;
e) forming a vertical channel in said first opening traversing through said pad layers and said plurality of etch stop layers;
f) forming at least first and second vertical gates in said vertical channel; and
g) connecting said plurality of contacts to said substrate whereby at least one of said contacts connects to said vertical channel, while at least another of said contacts connects to said second opening traversing through said pad layers and said plurality of etch stop layers, while still other contacts connect to said first and second gates, thereby providing said first FET having said first gate length; and repeating steps a) through g) to provide a plurality of FETs having differing gate lengths over said die.

* * * * *